United States Patent
Lee et al.

(10) Patent No.: US 9,033,533 B2
(45) Date of Patent: May 19, 2015

(54) DISPLAY APPARATUS

(75) Inventors: HyunSeok Lee, Suwon-si (KR); SangRyeon Park, Gumi-si (KR)

(73) Assignee: LG Display Co., Ltd., Seoul (KR)

( * ) Notice: Subject to any disclaimer, the term of this patent is extended or adjusted under 35 U.S.C. 154(b) by 661 days.

(21) Appl. No.: 13/338,720

(22) Filed: Dec. 28, 2011

(65) Prior Publication Data

US 2012/0262907 A1 Oct. 18, 2012

(30) Foreign Application Priority Data

Apr. 18, 2011 (KR) .................. 10-2011-0035888

(51) Int. Cl.
G09F 13/04 (2006.01)
H05K 5/02 (2006.01)
G06F 1/16 (2006.01)

(52) U.S. Cl.
CPC ............. *H05K 5/02* (2013.01); *G06F 1/1601* (2013.01); *G06F 1/1637* (2013.01); *G06F 2200/1612* (2013.01)

(58) Field of Classification Search
CPC ....... H05K 5/02; G06F 1/1601; G06F 1/1637; G02F 1/13; G02F 1/133; G09F 13/04
USPC .............. 361/679.01, 807; 362/97.1
See application file for complete search history.

(56) References Cited

U.S. PATENT DOCUMENTS

| | | |
|---|---|---|
| 6,330,148 B1 | 12/2001 | Won et al. |
| 2003/0227581 A1 | 12/2003 | Sung et al. |
| 2004/0041961 A1 | 3/2004 | Lee |
| 2008/0101001 A1 | 5/2008 | Shin et al. |
| 2008/0278895 A1 | 11/2008 | Woo |
| 2011/0260959 A1* | 10/2011 | Son et al. ...................... 345/102 |
| 2011/0260960 A1* | 10/2011 | Jean et al. .................... 345/102 |
| 2012/0268686 A1* | 10/2012 | Lee et al. ........................ 349/59 |

FOREIGN PATENT DOCUMENTS

| | | |
|---|---|---|
| CN | 1467542 | 1/2004 |
| CN | 1487337 | 4/2004 |
| CN | 101206317 | 6/2008 |

* cited by examiner

*Primary Examiner* — Andrew Coughlin
(74) *Attorney, Agent, or Firm* — Morgan, Lewis & Bockius LLP

(57) ABSTRACT

Disclosed is a display apparatus which does not use some elements of cases and set cover members necessary for producing the display apparatus and thus can minimize a thickness and enhance a sense of beauty with an innovative design. The display apparatus includes a display panel, a panel supporting member, an adhesive member, a guide frame, and a cover member. The panel supporting member is disposed to have a side inserting space, and supports a rear edge of the display panel. The adhesive member is disposed at the panel supporting member, and couples the display panel and the panel supporting member. The guide frame supports the panel supporting member. The cover member is inserted into the side inserting space of the panel supporting member, and surrounds a side surface of the guide frame, thereby enabling movement of the panel supporting member.

23 Claims, 12 Drawing Sheets

DISPLAY APPARATUS

CROSS-REFERENCE TO RELATED APPLICATIONS

This application claims the benefit of the Korean Patent Application No. 10-2011-0035888 filed on Apr. 18, 2011, which is hereby incorporated by reference as if fully set forth herein.

BACKGROUND

1. Field of the Invention

The present invention relates to a display apparatus, and more particularly, to a display apparatus which does not use some elements of cases and set cover members necessary for producing the display apparatus and thus can minimize a thickness and enhance a sense of beauty with an innovative design.

2. Discussion of the Related Art

Recently, flat panel display apparatuses that can decrease a weight and a volume corresponding to the limitations of Cathode Ray Tubes (CRTs) are being developed. Liquid Crystal Display (LCD), Plasma Display Panels (PDPs), Field Emission Display (FED), and light emitting display are actively being researched as flat type display apparatuses. However, among such flat panel display apparatuses, Liquid Crystal Display are easily manufactured, have good drivability of drivers, realize a high-quality image, and thus are attracting much attention.

In terms of technology and design interesting to consumers, recently, research and development of flat panel display apparatuses are increasingly required. Therefore, efforts are being continuously made for minimizing (slimming) the thicknesses of display apparatuses, and research is increasingly conducted on a design with enhanced sense of beauty that can induce consumers to buy by appealing to the consumers' sense of beauty.

However, in design development for enhancing a scene of beauty or slimming of display apparatus that have been made to date, elements configuring a related art display apparatus have been applied as is, and the structures of the elements have been changed. Due to these reasons, there are limitations in slimming display apparatus and developing the new designs of the display apparatus. For example, in LCD of the related art, a lower case and a front case are necessarily used for receiving a liquid crystal display panel and a backlight unit, and moreover, a separate front set cover and rear set cover are additionally used for applying the LCD to notebook computers, monitors, mobile devices, televisions, etc. As described above, display apparatus of the related art necessarily use the front set cover and rear set cover as well as the lower case and front case, and consequently, there are limitations in reducing the thicknesses of LCD or changing the designs thereof. Particularly, the front set cover and rear set cover necessarily cover a top edge of a liquid crystal display panel. Due to this reason, the thicknesses of display apparatus inevitably become thicker, and moreover, the border widths of the display apparatus enlarge. In addition, it is difficult to realize various innovative designs due to a step height in a border portion.

SUMMARY

Accordingly, the present invention is directed to provide a display apparatus that substantially obviates one or more problems due to limitations and disadvantages of the related art.

An aspect of the present invention is directed to provide a display apparatus which does not use some elements of cases and set cover members necessary for producing the display apparatus and thus can minimize a thickness and enhance a sense of beauty with an innovative design.

Another aspect of the present invention is directed to provide a display apparatus which can prevent light leakage due to the non-movement of a display panel that is caused by removing some elements of cases and set cover members.

Additional advantages and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these and other advantages and in accordance with the purpose of the invention, as embodied and broadly described herein, there is provided a display apparatus including: a display panel; a panel supporting member disposed to have a side inserting space, and supporting a rear edge of the display panel; an adhesive member disposed at the panel supporting member, and coupling the display panel and the panel supporting member; a guide frame supporting the panel supporting member; and a cover member inserted into the side inserting space of the panel supporting member, and surrounding a side surface of the guide frame, thereby enabling movement of the panel supporting member.

A top and side surface of the display panel may be exposed to the outside without being surrounded by the guide frame and the cover member.

The panel supporting member may include: a frame disposing part disposed at the guide frame; a vertical portion formed vertically from the frame disposing part to have a certain height; and a panel disposing part bent from the vertical portion to face the frame disposing part, and forming the side inserting space and including a panel disposing part with the adhesive member disposed therein.

The cover member may include: a front cover inserted into the side inserting space of the panel supporting member; and a side cover bent from the front cover, and surrounding a side surface of the frame disposing part and the side surface of the guide frame.

The front cover may be inserted into the side inserting space to be respectively separated from the frame disposing part and the vertical portion by a certain distance.

The front cover may be inserted into the side inserting space to be separated from the frame disposing part by a certain distance.

The cover member may be formed in a tetragonal frame shape to have a ⊂-shaped sectional surface by the front cover and the side cover.

The display apparatus may further include a coupling member coupled to the guide frame through the side cover of the cover member to fix the cover member.

The cover member may further include a rear cover which is bent from the side cover to face a rear surface of the supporting cover, and the coupling member may be coupled to the supporting cover through the rear cover to fix the cover member.

The display apparatus may further include a set cover supporting the supporting cover, and surrounding the side cover of the cover member and a side surface of the display panel other than a front surface of the display panel.

The display panel may be disposed to overlap with an entire top of the front cover, and the panel disposing part may be disposed to overlap with the entire top of the front cover.

The display apparatus may further include a set cover supporting the supporting cover, and surrounding the side cover of the cover member and a side surface of the display panel other than a front surface of the display panel.

The panel supporting member may be formed in a tetragonal frame shape to include the frame disposing part, vertical portion, and panel disposing part.

The panel supporting member may further include a plurality of slits which are disposed at certain intervals in at least one of the panel disposing part and the frame disposing part.

The panel supporting member may include first to fourth supporting brackets which are formed to include the frame disposing part, vertical portion, and panel disposing part, coupled to respective edge portions of long sides and short sides of the display panel by the adhesive member, and supported by the guide frame.

The panel supporting member may further include a plurality of slits which are formed at certain intervals at the panel disposing part of each of the first to fourth supporting brackets, the adhesive member being disposed at the panel disposing part.

The panel supporting member may include first to fourth supporting brackets which are formed to include the frame disposing part, vertical portion, and panel disposing part, coupled to respective rear edge portions of the display panel at certain intervals by the adhesive member, and supported by the guide frame.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE INVENTION

Reference will now be made in detail to the exemplary embodiments of the present invention, examples of which are illustrated in the accompanying drawings. Wherever possible, the same reference numbers will be used throughout the drawings to refer to the same or like parts.

Hereinafter, a display apparatus according to embodiments of the present invention will be described in detail with reference to the accompanying drawings.

Figure 1:
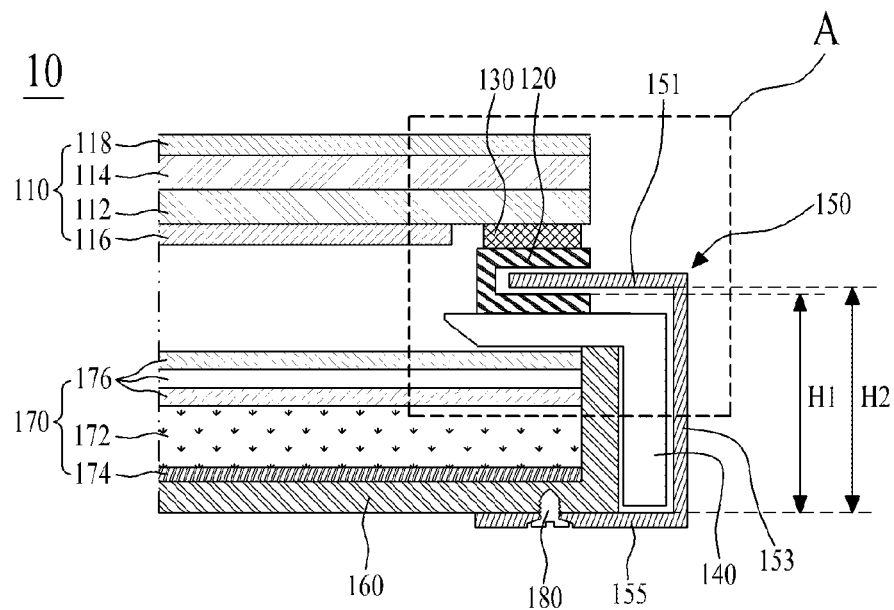
FIG. 1 is a view schematically illustrating a display apparatus according to a first embodiment of the present invention.
Figure 2:
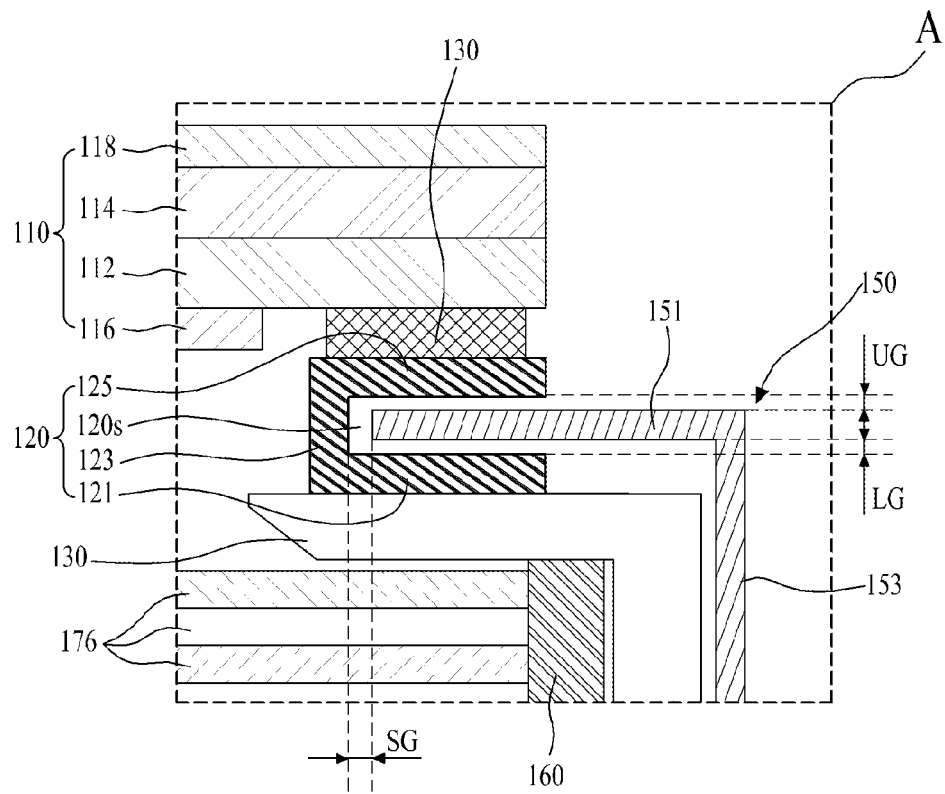
FIG. 2 is an enlarged view of a portion A of FIG. 1.

FIG. 1 is a view schematically illustrating a display apparatus according to a first embodiment of the present invention. FIG. 2 is an enlarged view of a portion A of FIG. 1.

Referring to FIGS. 1 and 2, a display apparatus 10 according to the first embodiment of the present invention includes a display panel 110, a panel supporting member 120 that is formed to have a side inserting space 120s and supports a rear edge of the display panel 110, an adhesive member 130 that is formed at the panel supporting member 120 and couples the display panel 110 and the panel supporting member 120, a guide frame 140 that supports the panel supporting member 120, and a cover member 150 that is inserted into the side inserting space 120s of the panel supporting member 120 and disposed to surround a side surface of the guide frame 140 so as to enable the movement of the panel supporting member 120.

The display panel 110 may be a liquid crystal display panel or an organic light emitting display panel that includes a facing-coupled lower substrate 112 and upper substrate 114.

In an embodiment, when the display panel 110 is the liquid crystal display panel, the display panel 110 include the lower substrate 112 and upper substrate 114 that are facing-coupled to each other with a liquid crystal layer (not shown) therebetween, a lower polarizer 116 adhered to the lower substrate 112, and an upper polarizer 118 adhered to entire one surface of the upper substrate 114.

In another embodiment, when the display panel 110 is the organic light emitting display panel, the display panel 110 includes the facing-coupled lower substrate 112 and upper substrate 114, and depending on the case, the display panel 110 may further include the upper polarizer 118 adhered to entire one surface of the upper substrate 114.

The display panel 110 may further include a plurality of circuit films (not shown) adhered to the lower substrate 112, and a Printed Circuit Board (PCB) adhered to the circuit films. Herein, the circuit films may be adhered to the lower substrate 112 and the PCB by a Tape Automated Bonding (TAB) process, and may be a Tape Carrier Package (TCP) or Chip On Flexible Board/Chip On Film (COF).

The panel supporting member 120 is formed to have the side inserting space 120s and coupled to the rear edge portion of the display panel 110 by the adhesive member 130. The panel supporting member 120 is coupled to the rear edge portion of the display panel 110 by the adhesive member 130 and movably disposed at the guide frame 140.

Figure 3:
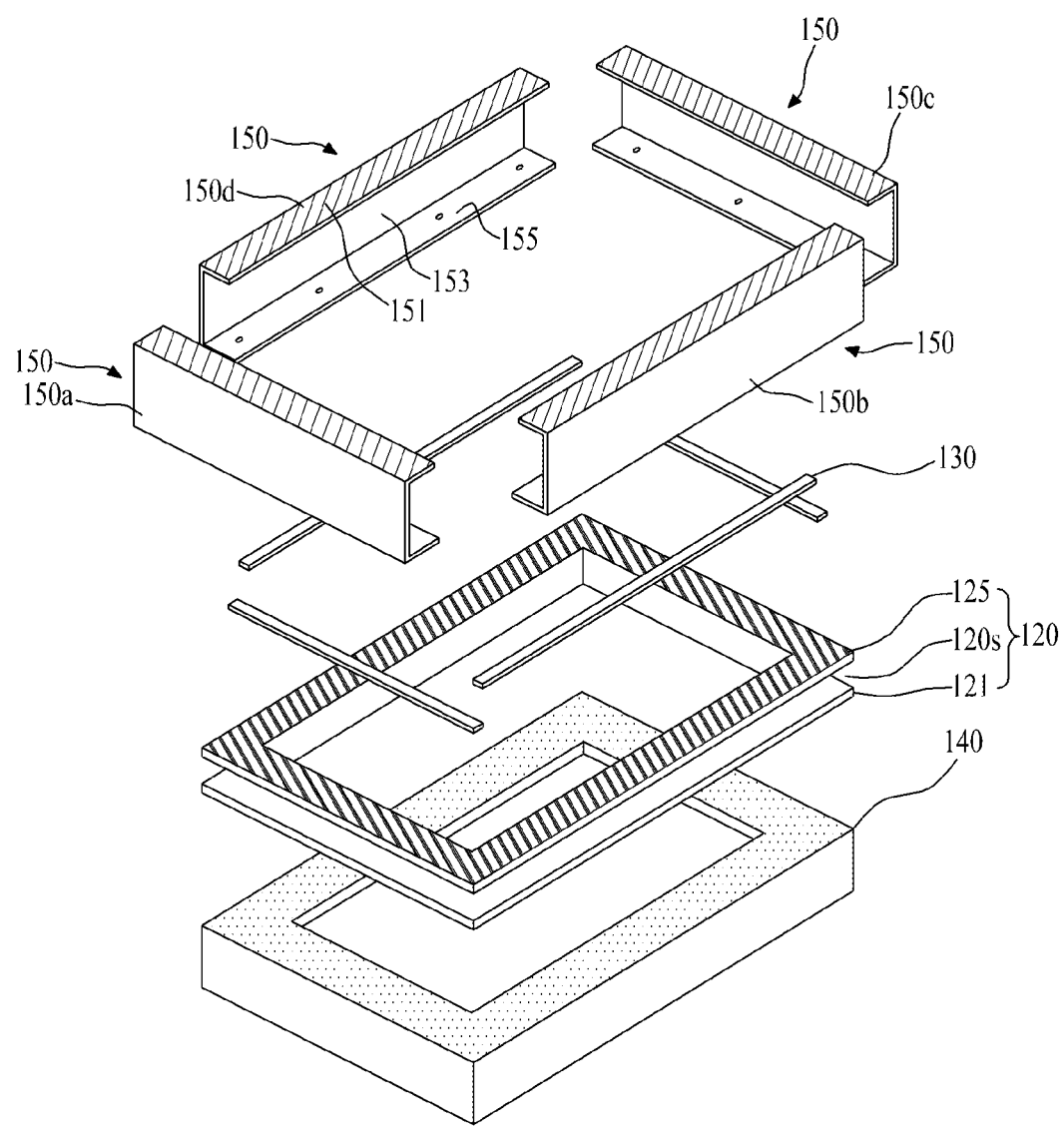
FIG. 3 is a view for describing a guide frame, panel supporting member, adhesive member, and cover member of FIG. 1.

A panel supporting member 120 according to a first embodiment, as illustrated in FIG. 3, is formed in a tetragonal frame shape to have a ⊂-shaped sectional surface and supports the rear edge portion of the display panel 110. For this end, the panel supporting member 120 includes a frame disposing part 121, a vertical portion 123, and a panel disposing part 125.

The frame disposing part 121 is formed in a flat type, and disposed at the guide frame 140.

The vertical portion 123 is formed vertically from the frame disposing part 121 to have a certain height. For example, the vertical portion 123 may be bent from an inner end of the frame disposing part 121.

The panel disposing part 125 is bent from the vertical portion 123 to face the frame disposing part 121, thereby forming the side inserting space 120s. In this case, the side inserting space 120s is prepared in a space between the frame disposing part 121 and panel disposing part 125 that face each other with the vertical portion 123 between one side of the disposing part 121 and one side of the panel disposing part 125.

Figure 4:
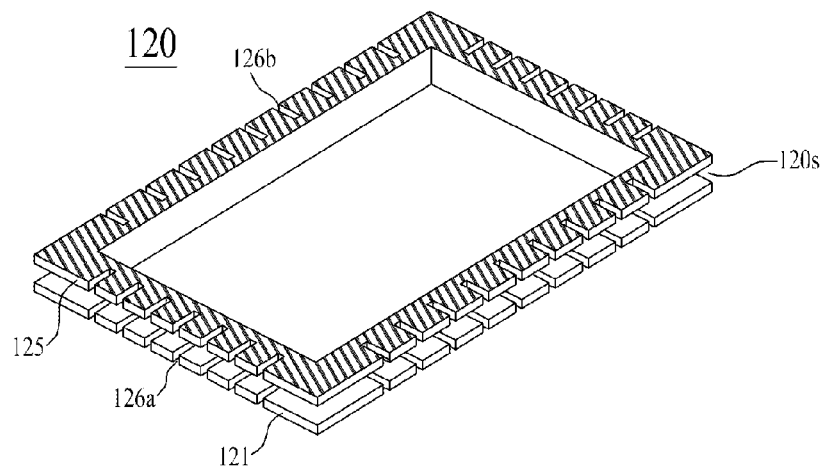
FIG. 4 is a view for describing another embodiment of the panel supporting member of FIG. 3 according to a first embodiment of the present invention.

The panel supporting member 120 according to the first embodiment, as illustrated in FIG. 4, may further include a plurality of slits 126a and 126b that are formed at certain intervals, in at least one of the frame disposing part 121 and the panel disposing part 125.

Each of the slits 126a and 126b divide the frame disposing part 121 and/or the panel disposing part 125 at certain intervals. Therefore, the frame disposing part 121 and/or the panel disposing part 125 divided by the slits 126a and 126b have a certain elastic force and thus move in a Z-axis direction.

Figure 5:
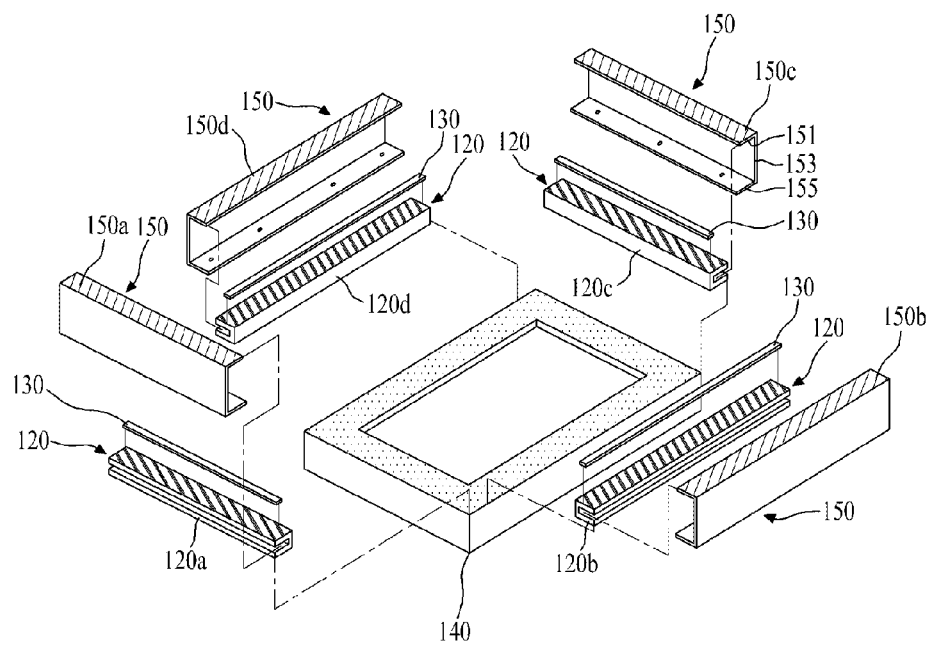
FIG. 5 is a view for describing a panel supporting member of FIG. 1 according to a second embodiment of the present invention.

A panel supporting member 120 according to a second embodiment, as illustrated in FIG. 5, includes first to fourth supporting brackets 120a to 120d that are coupled to the rear edge portions of respective long sides and short sides of the display panel 110, and supported by the guide frame 140.

Each of the first to fourth supporting brackets 120a to 120d is formed to include the frame disposing part 121, vertical portion 123, and panel disposing part 125, and disposed at the guide frame 140. Therefore, each of the first to fourth supporting brackets 120a to 120d disposed at the guide frame 140 has a tetragonal frame shape.

Figure 6:
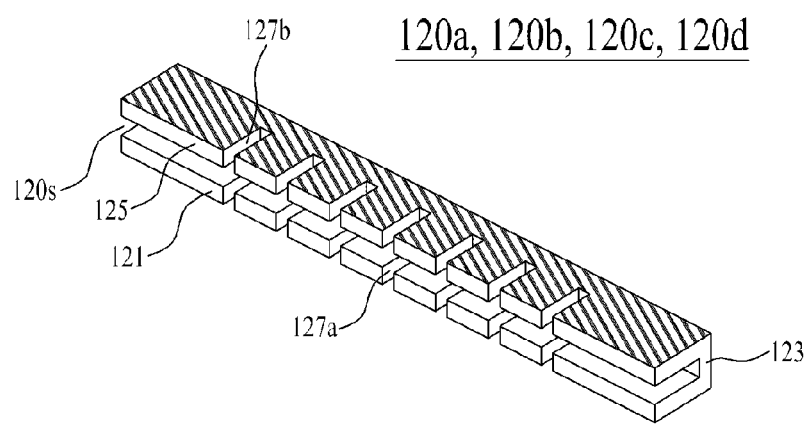
FIG. 6 is a view for describing another embodiment of the panel supporting member of FIG. 5 according to the second embodiment of the present invention.

The panel supporting member 120 according to the second embodiment, as illustrated in FIG. 6, may further include a plurality of slits 127a and 127b that are formed at certain intervals, at the frame disposing part 121 and/or panel disposing part 125 of each of the first to fourth supporting brackets 120a to 120d.

Each of the slits 127a and 127b divides the frame disposing part 121 and/or panel disposing part 125 of each of the first to fourth supporting brackets 120a to 120d at certain intervals. Therefore, the frame disposing part 121 and/or panel disposing part 125 of each of the first to fourth supporting brackets 120a to 120d divided by each of the slits 127a and 127b have a certain elastic force and thus move in a Z-axis direction.

Figure 7:
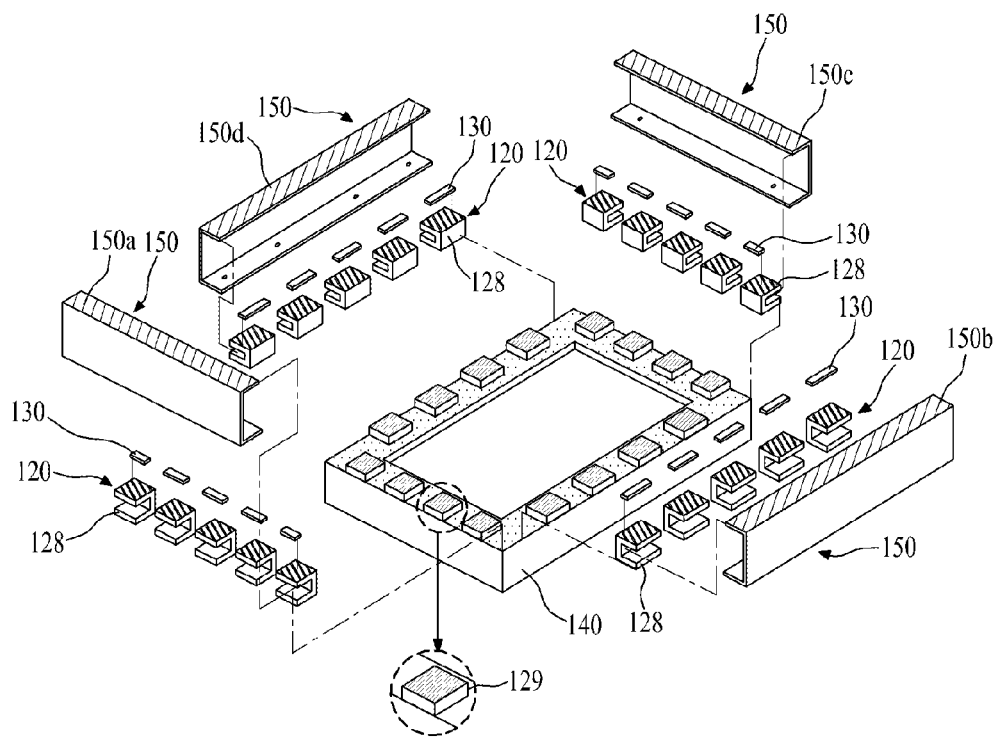
FIGS. 7 and 8 are views for describing a panel supporting member of FIG. 1 according to a third embodiment of the present invention.

A panel supporting member 120 according to a third embodiment, as illustrated in FIG. 7, includes a plurality of supporting brackets 128 that partially support the rear edge portions of respective long sides and short sides of the display panel 110.

Each of the supporting brackets 128 is formed to include the frame disposing part 121, vertical portion 123, and panel disposing part 125, and disposed at certain intervals at the guide frame 140.

When the display panel 110 is a liquid crystal display panel, in performing the high temperature deformation of the display panel 110, light leakage such as the spot of the display panel 110 occurs by the direct contact of the display panel 110 and both side ends of each of the supporting brackets 128, and the degree of deformation of the display panel 110 that is concentrated on both side ends of each of the supporting brackets 128. To prevent such limitations, as illustrated in FIG. 9, each supporting bracket 128 of FIG. 7 may further include a pair of adhesive member guide parts 125a, and a plurality of corner cutting parts 125b that are respectively formed at both side ends of each of the pair of adhesive member guide parts 125a.

The pair of adhesive member guide parts 125a are parallely formed to be separated from each other at a top of the panel disposing part 125, and thus facilitates the formation of the adhesive member 120. In this case, the adhesive member guide part 125a is formed to have a height lower than that of the adhesive member 130 which is formed at the top of the panel disposing part 125.

The corner cutting part 125b is concavely formed to have a certain slope or a curvature in a length direction of each of the pair of adhesive member guide parts 125a, at both side ends (border portion) of each of the adhesive member guide part 125a. The corner cutting part 125b forms a certain gap between the display panel 110 and both side ends of the supporting bracket 128 when the display panel 110 and the supporting bracket 128 are deformed by the high temperature deformation of the display panel 110, and thus prevents both side ends of the supporting bracket 128 from contacting the display panel 110, thereby preventing light leakage such as the spot of the display panel 110.

Figure 9:
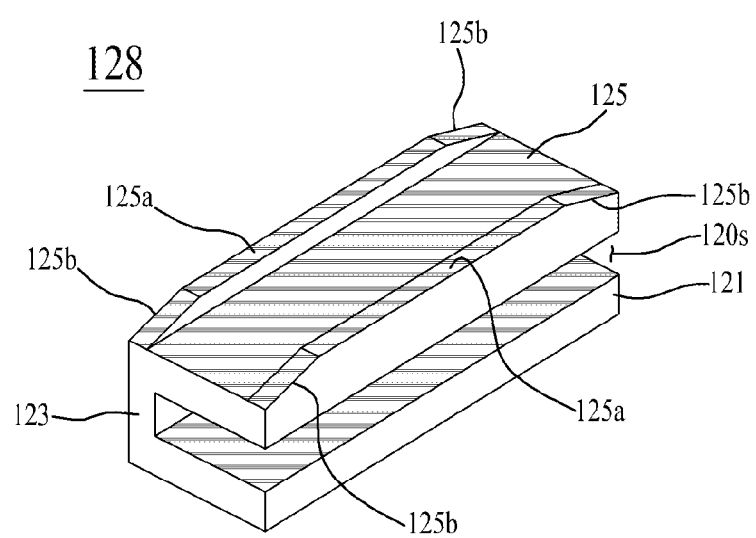
FIGS. 9 to 11 are views for describing modification embodiments of a supporting bracket of FIG. 7.
Figure 10:
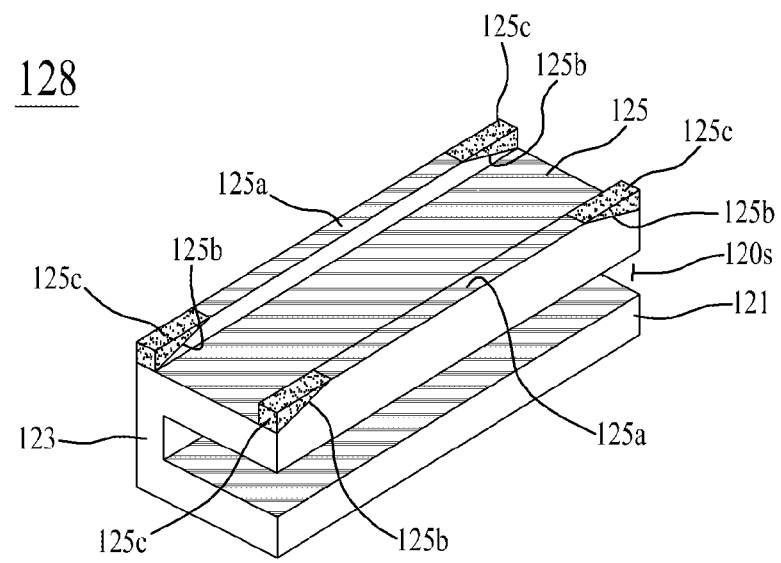
Figure 11:
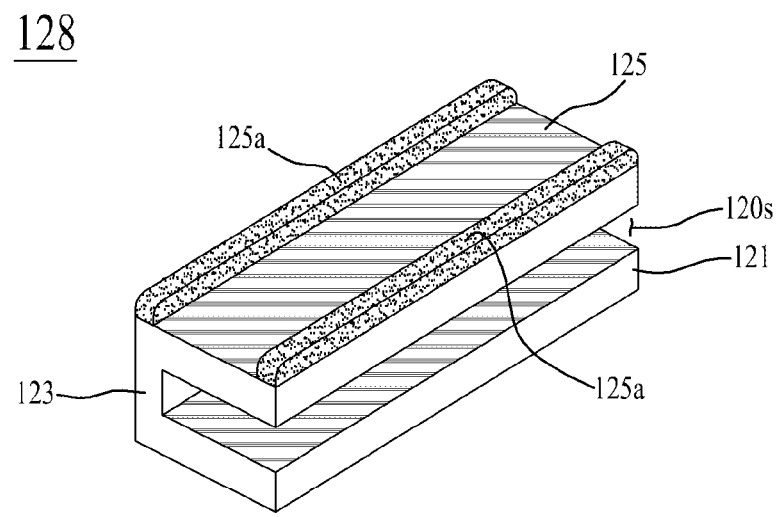

Each supporting bracket 128 of FIG. 9, as illustrated in FIG. 10, may further include a pad member 125c that is formed at each of the corner cutting parts 125b.

The pad member 125c is formed at a corner cutting part 125b and forms corner portions of both side ends of each of the adhesive member guide parts 125a. The pad member 125c is formed of a material different from that of the adhesive member guide part 125a, for example, may be formed of a soft material such as rubber, urethane, elastomer, or silicon. The pad member 125c may be simultaneously formed together with the adhesive member guide part 125a, in a double injection process or an insert injection process. Since the pad member 125c is formed of a soft material, the pad member 127b is deformed by the contact of the display panel 110 in performing the high temperature deformation of the display panel 110, and thus, a stress is prevented from being concentrated on the display panel 110 by both side ends (side surface corner portions) of each of the supporting bracket 128, thereby preventing light leakage such as the spot of the display panel 110.

On the other hand, each supporting bracket 128 of FIG. 7 further includes a pair of adhesive member guide parts 125a that are formed of a soft material.

The pair of adhesive member guide parts 125a are parallely formed to be separated from each other at a top of the panel disposing part 125, and thus facilitates the formation of the adhesive member 120. In this case, the adhesive member guide part 125a is formed to have a height lower than that of the adhesive member 130 which is formed at the top of the panel disposing part 125. Each of the adhesive member guide parts 125a may be formed of a soft material, for example, rubber, urethane, elastomer, or silicon. Each of the adhesive member guide parts 125a formed of the soft material may be simultaneously formed together with the supporting bracket 128, in a double injection process or an insert injection process. Each of the adhesive member guide parts 125a formed of the soft material defines a position where the adhesive member 130 is formed, and thus facilitates a process of forming the adhesive member guide part 125a. Also, each of the adhesive member guide parts 125a formed of the soft material is deformed by the contact of the display panel 110 in performing the high temperature deformation of the display panel 110, and thus, a stress is prevented from being concentrated on the display panel 110, thereby preventing light leakage such as the spot of the display panel 110.

Figure 8:
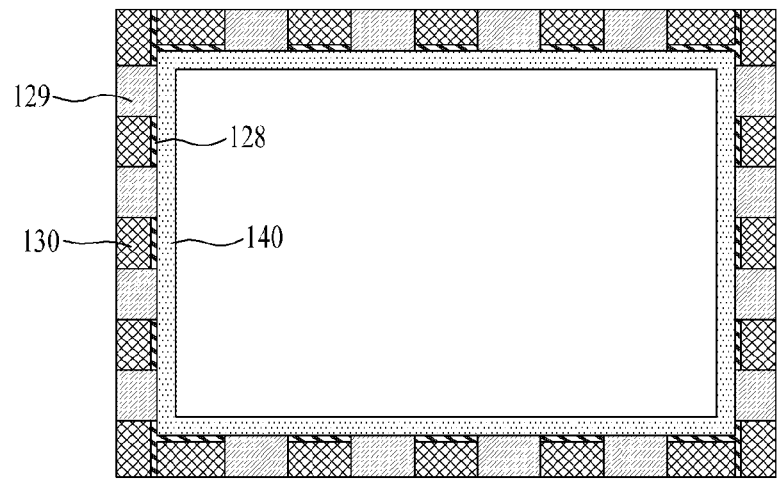

Referring again to FIGS. 7 and 8, when the display panel 110 is the liquid crystal display panel, light leakage occurs in a space between the supporting brackets 128 that are disposed at the guide frame 140 at certain intervals. Therefore, the display apparatus 10 according to the first embodiment, as illustrated in FIGS. 7 and 8, may further include a plurality of pads 129 that seal respective gaps between the supporting brackets 128.

The pads 129 are formed at the guide frame 140 in correspondence with the respective gaps between the supporting brackets 128, and seal seal respective gaps between the supporting brackets 128 by contacting the rear surface of the display panel 110.

Referring again to FIGS. 1 and 2, the adhesive member 130 is formed at the panel disposing part 125 of the panel supporting member 120 and couples the display panel 110 and the panel supporting member 120. In this case, as illustrated in FIG. 3, 5 or 7, the adhesive member 130 may be formed in correspondence with a length of each of the short side and long side of the display panel 110, or formed to have a certain length according to the structure of the panel supporting member 120. That is, the adhesive member 130 is formed at the panel disposing part 125 of the panel supporting member 120 according to any one of the above-described first to third embodiments of FIGS. 3 to 7. The adhesive member 130 may be a double-sided tape adhered to the panel disposing part 125, or an adhesive (for example, a thermosetting adhesive, or a photocurable adhesive) coated on the panel disposing part 125.

The guide frame 140 is formed in a tetragonal frame shape to include a supporting part that supports the panel supporting member 120 and a guide side wall that is bent vertically from the supporting part, and supports the panel supporting member 120. That is, the guide frame 140 is formed to have a ¬ -shaped sectional shape, and movably supports the panel supporting member 120 with the supporting part.

The display apparatus 10 according to the first embodiment may further include a supporting cover 160 for supporting the guide frame 140.

The supporting cover 160 is formed in a U-shape to have a receiving space, and supports the supporting part of the guide frame 140. Herein, when the display panel 110 is the liquid crystal display panel, a backlight unit 170 for irradiating light on the display panel 110 is placed in the receiving space of the supporting cover 160.

The backlight unit 170, as illustrated in FIG. 1, includes a light guide panel 172, a reflective sheet 174, and an optical member 176.

The light guide panel 172 is formed in a flat type (or a wedge type) to have a light incident surface, and guides light, inputted from a light source (not shown) through the light incident surface, to the display panel 110. Herein, the light source may include a fluorescent lamp or a Light Emitting Diode (LED).

The reflective sheet 174 is disposed at a rear surface of the light guide panel 172 and reflects light, inputted from the light guide panel 172, to the display panel 110.

The optical member 176 is disposed on the light guide panel 172 and enhances the luminance characteristic of light traveling from the light guide panel 172 to the display panel 110. For this end, the optical member 176 may include at least two of a lower diffusive sheet, a lower prism sheet, an upper prism sheet, and an upper diffusive sheet.

The cover member 150 is inserted into the side inserting space 120s of the panel supporting member 120 and disposed to surround a side surface of the panel supporting member 120, a side surface of the guide frame 140, and a rear surface of the supporting cover 160, in order to enable the movement of the panel supporting member 120 coupled to the display panel 110. Therefore, a top and side surface of the display panel 110 are exposed to the outside without being surrounded by the guide frame 140 and the cover member 150. That is, in the display apparatus 10 according to the first embodiment, the display panel 110 is coupled to the panel supporting member 120 by the adhesive member 130, the panel supporting member 120 coupled to the display panel 110 is disposed at the guide frame 140, and then the cover member 150 movably surrounds the panel supporting member 120, thus removing the existing upper case that surrounds a front edge portion of the display panel 110.

The cover member 150, as illustrated in FIGS. 1 to 3, includes first to fourth cover brackets 150a to 150d that are inserted into respective side inserting spaces 120s of the panel supporting member 120, disposed at respective edge portions of the short sides and long sides of the guide frame 140, and disposed to surround the frame disposing part 121 of the panel supporting member 120 and the side surface of the guide frame 140.

Each of the first to fourth cover brackets 150a to 150d includes a front cover 151, a side cover 153, and a rear cover 155.

The front cover 151 is formed in a "–"-shape to be inserted into the side inserting space 120s of the panel supporting part 120. In this case, a length of the front cover 151 is formed longer than that of the frame disposing part 121. The front cover 151 is inserted into the side inserting space 120s of the panel supporting member 120, and thus a lower gap LG (see FIG. 2) and a side gap SG (see FIG. 2) are prepared so as to enable the movement of the panel supporting member 120.

The lower gap LG is prepared to have a height less than about 1.5 mm, in the side inserting space 120s between the front cover 151 and the frame disposing part 121. Therefore, the panel supporting member 120 coupled to the display panel 110 moves in at least one of Y-axis and Z-axis directions, inside the lower gap LG.

The side gap SG is prepared to have a width less than about 2 mm, in the side inserting space 120s between a side surface of the front cover 151 and the vertical portion 123. Therefore, the panel supporting member 120 coupled to the display panel 110 moves in at least one of Y-axis and Z-axis directions, inside the lower gap LG.

The front cover 151 is inserted into the side inserting space 120s of the panel supporting member 120, and thus, an upper gap UG (see FIG. 2) that enables the movement of the display panel 110 in a Z-axis direction may be further prepared by an elastic force of the panel disposing part 125 of the panel supporting member 120.

The upper gap UG is a space between the front cover 151 and the panel disposing part 125, and prepared to have a height less than about 1 mm. Therefore, the display panel 110 coupled to the panel supporting member 120 may move in a Z-axis direction by the elastic force of the panel disposing part 125, inside the upper gap UG.

The side cover 153 is bent vertically from an outer end of the front cover 151 and surrounds the side surface of the panel disposing part 125 and the side surface of the guide frame 140. In this case, a height of the side cover 153 is formed higher than a height from the rear surface of the supporting cover 160 to a top of the frame disposing part 121 of the panel supporting member 120 such that the lower gap LG is prepared at the panel supporting member 120. That is, the height (H2=H1+LG) of the side cover 153 is formed higher by the upper gap UG than an entire height H1 of the supporting cover 160 and panel disposing part 121.

The rear cover 155 is bent from the side cover 153 to face the rear surface of the supporting cover 160. The rear cover 155 is fixed to the supporting cover 160 by a coupling member 180 that is coupled to a bottom of the supporting cover 160 through the rear cover 155. Therefore, the panel supporting member 120 coupled to the display panel 110 may move in at least one of X-axis, Y-axis, and Z-axis directions, inside the lower gap LG and side gap SG that are prepared by the front cover 151 of the cover member 150 inserted into the side inserting space 120s.

In the display apparatus 10 according to the first embodiment, the display panel 110 is coupled to the panel supporting member 120 by the adhesive member 130, and then the panel supporting member 120 coupled to the display panel 110 is disposed at the guide frame 140, thus removing the existing upper case. In this case, the display panel 110 may be directly coupled to the guide frame 140 by the adhesive member 130 instead of the panel supporting member 120. However, when the display panel 110 is the liquid crystal display panel, since the display panel 110 is fixed to the guide frame 140 by the adhesive member 130, a liquid crystal layer is changed because the display panel 110 is pressed by an external force that is applied to the display panel 110 adhered to the adhesive member 130, or the liquid crystal layer is changed by an adhesive strength due to the adhesive member 130, causing light leakage. That is, the light leakage can be regarded as being caused by the non-movement of the display panel 110.

Therefore, in the display apparatus 10 according to the first embodiment of the present invention, the panel supporting member 120 coupled to the display panel 110 moves inside the lower gap LG and side gap SG that are prepared in the side inserting space 120s of the panel supporting member 120 by the cover member 150, thus preventing light leakage.

In the display apparatus 10 according to the first embodiment, the display panel 110 is coupled to the panel supporting member 120 by the adhesive member 130, the panel supporting member 120 coupled to the display panel 110 is disposed at the guide frame 140, and then the cover member 150 is inserted into the side inserting space 120s of the panel supporting member 120 so as to enable the movement of the panel supporting member 120 coupled to the display panel 110, thereby removing the existing upper. Accordingly, the thickness of the display panel 110 is minimized, and the entire front surface of the display panel 110 is exposed to the outside, thus enhancing a sense of beauty in design. In the display apparatus 10 according to the first embodiment, the panel supporting member 120 coupled to the display panel 110 may move through the cover member 150, thereby preventing light leakage that is caused by the non-movement of the display panel 110.

Figure 12:
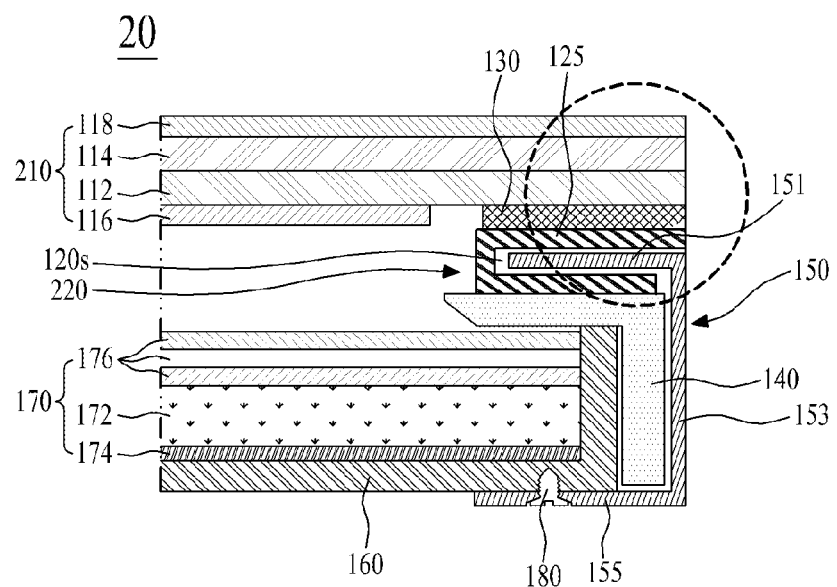
FIG. 12 is a view schematically illustrating a display apparatus according to a second embodiment of the present invention.

FIG. 12 is a view schematically illustrating a display apparatus according to a second embodiment of the present invention.

Referring to FIG. 12, a display apparatus 20 according to the second embodiment of the present invention includes a display panel 210, a panel supporting member 220 that is formed to have a side inserting space 120s and supports a rear edge of the display panel 210, an adhesive member 130 that is formed at the panel supporting member 220 and couples the display panel 210 and the panel supporting member 220, a guide frame 140 that supports the panel supporting member 220, and a cover member 150 that is inserted into the side inserting space 120s of the panel supporting member 220 and disposed to surround a side surface of the guide frame 140 so as to enable the movement of the panel supporting member 220. Except for the display panel 210 and the panel supporting member 220, the display apparatus 20 having such a configuration includes the same elements as those of the display apparatus 10 according to the first embodiment of the present invention, and thus, the description of the display apparatus 10 is applied to the same elements.

The display panel 210, as illustrated in a circular dot line of FIG. 12, is configured identically to the display panel 110 of the display apparatus 10 according to the first embodiment of the present invention, except that the display panel 210 is formed longer than the display panel 110 to overlap with an entire front cover 151 of the cover member 150.

The panel supporting member 220 is configured identically to the panel supporting member 120 of the display apparatus 10 according to the first embodiment of the present invention, except that the panel supporting member 220 is formed longer than the panel supporting member 120 in order for the panel disposing part 125 to overlap with the entire front cover 151.

The front cover 151 of the cover member 150 overlaps with a panel disposing part 125 of the panel supporting member 220 and the display panel 210, and thus is not exposed to the outside.

In the display apparatus 20 according to the second embodiment of the present invention, the display panel 210 is formed to overlap with the front cover 151 of the cover member 150, and thus can configure a display product such as a television even without a separate element, for example, a set cover. However, in the display apparatus 10 according to the first embodiment of the present invention, since a portion of the front cover 151 is exposed to the outside, a separate element such as the set cover is required for configuring a display product. Therefore, the display apparatus 10 according to the first embodiment of the present invention may be used as a display module, for example, a liquid crystal display module, but the display apparatus 20 according to the second embodiment of the present invention may be used as a display module or a display product.

The display apparatus 20 according to the second embodiment of the present invention can provide the same effects as those of the display apparatus 10 according to the first embodiment of the present invention. Moreover, in the display apparatus 20 according to the second embodiment of the present invention, the display panel 210 is formed to overlap with the front cover 151 of the cover member 150, thus more enhancing a sense of beauty in design.

Figure 13:
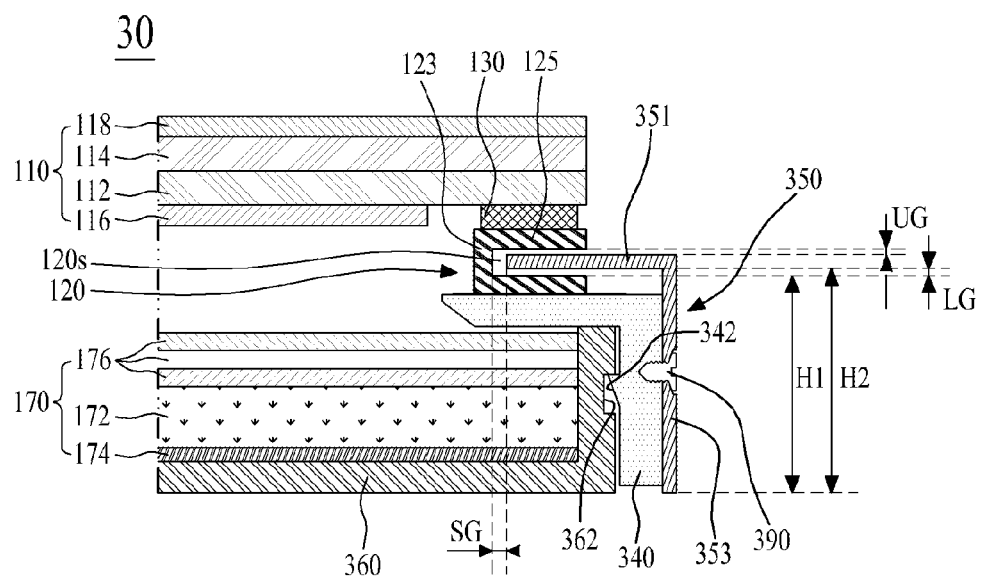
FIG. 13 is a view schematically illustrating a display apparatus according to a third embodiment of the present invention.

FIG. 13 is a view schematically illustrating a display apparatus according to a third embodiment of the present invention.

Referring to FIG. 13, a display apparatus 30 according to the third embodiment of the present invention includes a display panel 110, a panel supporting member 120 that is formed to have a side inserting space 120s and supports a rear edge of the display panel 110, an adhesive member 130 that is formed at the panel supporting member 120 and couples the display panel 110 and the panel supporting member 120, a guide frame 340 that supports the panel supporting member 120, a supporting cover 360 that supports the guide frame 340, and a cover member 350 that is inserted into the side inserting space 120s of the panel supporting member 120 and disposed to surround a side surface of the guide frame 340 so as to enable the movement of the panel supporting member 120. Except for the guide frame 340, supporting cover 360, and cover member 350, the display apparatus 30 having such a configuration includes the same elements as those of the display apparatus 10 according to the first embodiment of the present invention, and thus, the description of the display apparatus 10 is applied to the same elements.

The guide frame 340 is formed in a tetragonal frame shape to include a supporting part that supports the panel supporting member 120 and a guide side wall that is bent vertically from the supporting part, and supports the panel supporting member 120. That is, the guide frame 340 is formed to have a ⌐-shaped sectional shape, and supports the panel supporting member 120 with the supporting part. The guide frame 340 is coupled to the supporting cover 360. For this end, the guide frame 340 includes a first coupling member 342 that is formed at the supporting part facing the supporting cover 360. The first coupling member 342 is formed to have a stepped portion and an inclined portion from an inner surface of the supporting part, and coupled to the supporting cover 360.

The supporting cover 360 is formed in a U-shape to have a receiving space, and supports the supporting part of the guide frame 340. Herein, when the display panel 110 is the liquid crystal display panel, a backlight unit 170 for irradiating light on the display panel 110 is placed in the receiving space of the supporting cover 360. The supporting cover 360 includes a second coupling member 362 coupled to the first coupling member 342 that is formed at the guide frame 340. The second coupling member 362 is concavely formed at a supporting side wall that supports the guide frame 340 to bind the stepped portion of the first coupling member 342 formed at the guide frame 340, and thus couples the guide frame 340 and the supporting cover 360.

The cover member 350 is inserted into the side inserting space 120s of the panel supporting member 120 and disposed to surround a side surface of the panel supporting member 120, a side surface of the guide frame 340, and a rear surface of the supporting cover 360, in order to enable the movement of the panel supporting member 120 coupled to the display panel 110. Therefore, a top and side surface of the display panel 110 are exposed to the outside without being surrounded by the guide frame 340 and the cover member 350.

Figure 14:
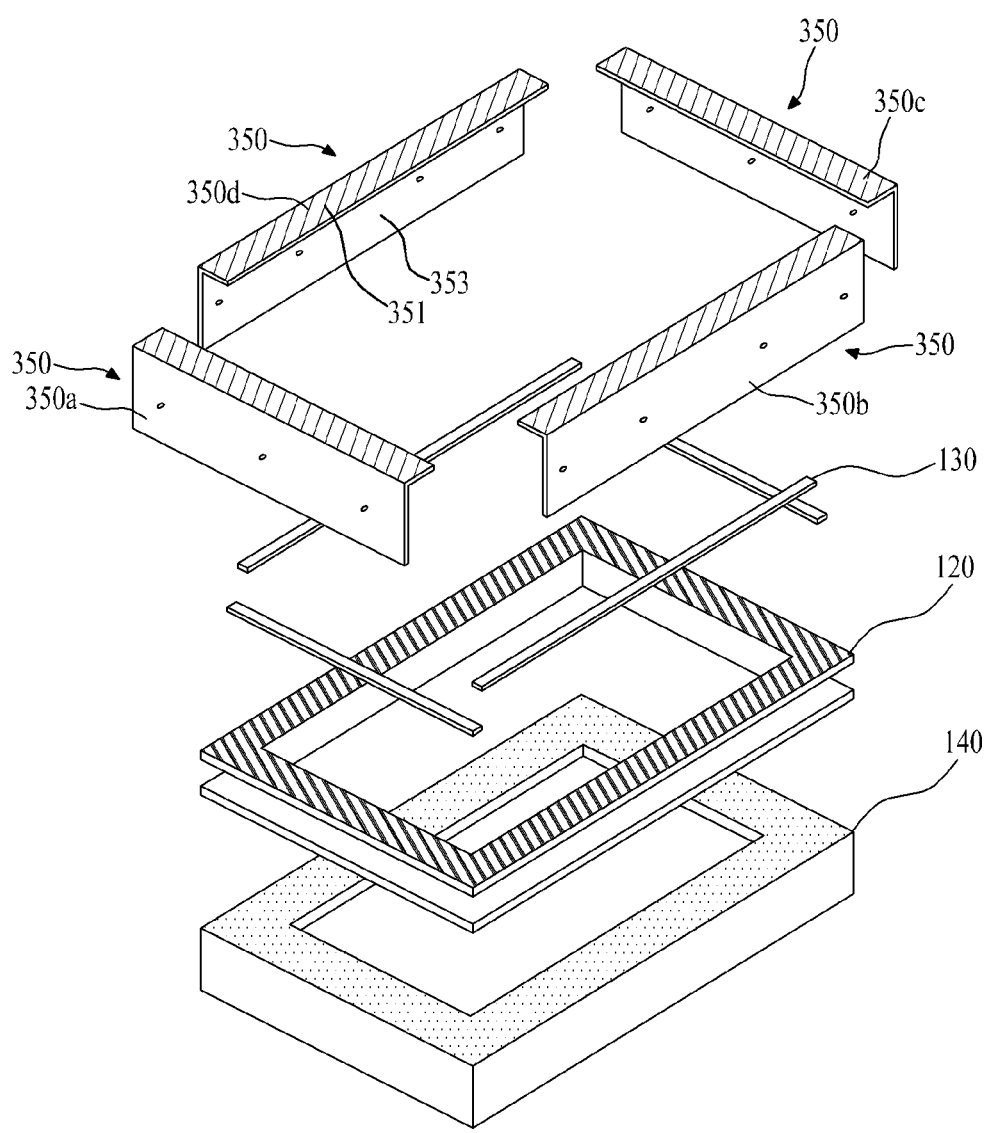
FIG. 14 is a view for describing an embodiment of a cover member of FIG. 13.

A cover member 350 according to an embodiment, as illustrated in FIG. 14, includes first to fourth cover brackets 350a to 350d that are inserted into respective side inserting spaces 120s of the panel supporting member 120, disposed at respective edge portions of the short sides and long sides of the guide frame 340, and disposed to surround the frame disposing part 121 of the panel supporting member 120 and the side surface of the guide frame 340.

Each of the first to fourth cover brackets 350a to 350d includes a front cover 351 and a side cover 353.

The front cover 351 is formed in a "–"-shape to be inserted into the side inserting space 120s of the panel supporting part 120. In this case, a length of the front cover 351 is formed longer than that of the frame disposing part 121. The front cover 151 is inserted into the side inserting space 120s of the panel supporting member 120, and thus a lower gap LG and a side gap SG are prepared in the side inserting space 120s with the front cover 351 inserted thereinto so as to enable the movement of the panel supporting member 120.

The lower gap LG is prepared to have a height less than about 1.5 mm, in the side inserting space 120s between the front cover 351 and the frame disposing part 121. Therefore, the panel supporting member 120 coupled to the display panel 110 moves in at least one of Y-axis and Z-axis directions, inside the lower gap LG.

The side gap SG is prepared to have a width less than about 2 mm, in the side inserting space 120s between a side surface of the front cover 351 and the vertical portion 123. Therefore, the panel supporting member 120 coupled to the display panel 110 moves in at least one of Y-axis and Z-axis directions, inside the lower gap LG.

The front cover 151 is inserted into the side inserting space 120s of the panel supporting member 120, and thus, an upper gap UG that enables the movement of the display panel 110 in a Z-axis direction may be further prepared by an elastic force of the panel disposing part 125, in the side inserting space 120s with the front cover 351 inserted thereinto.

The upper gap UG is prepared to have a height less than about 1 mm, between the front cover 351 and the panel disposing part 125. Therefore, the display panel 110 coupled to the panel supporting member 120 may move in a Z-axis direction by the elastic force of the panel disposing part 125, inside the upper gap UG.

The side cover 353 is bent vertically from an outer end of the front cover 351 and surrounds the side surface of the panel disposing part 125 and the side surface of the guide frame 340. In this case, a height of the side cover 153 is formed higher than a height from the rear surface of the supporting cover 360 to a top of the frame disposing part 121 of the panel supporting member 120 such that the lower gap LG is prepared in the side inserting space 120s of the panel supporting member 120. That is, the height (H2=H1+LG) of the side cover 353 is formed higher by the upper gap UG than an entire height H1 of the supporting cover 360 and panel disposing part 121.

Figure 15:
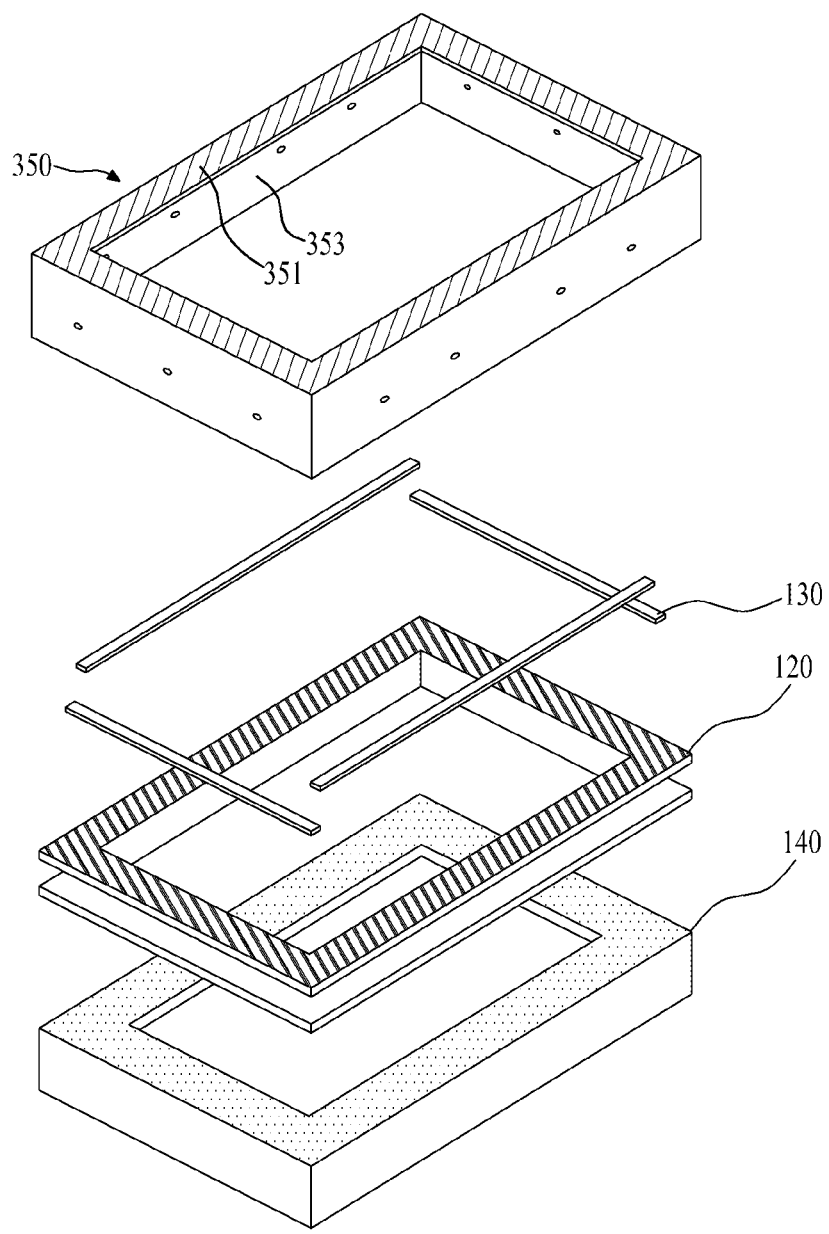
FIG. 15 is a view for describing another embodiment of the cover member of FIG. 13.

A cover member 350 according to another embodiment, as illustrated in FIG. 15, is formed to have a ⌐-shaped sectional shape, inserted into the side inserting space 120s of the panel supporting member 120 that is disposed at respective edge portions of the short sides and long sides of the guide frame 340, and disposed to surround the frame disposing part 121 of the panel supporting member 120 and the side surface of the guide frame 340. That is, the cover member 350 according to another embodiment is the same as the cover member 350 according to an embodiment, except that the first to fourth cover brackets 350a to 350d configuring the cover member 350 according to an embodiment are integrated with each other to form a tetragonal frame shape.

The side cover 353 is fixed to the guide side wall of the guide frame 340 by the screw 390, and thus, the cover member 350 is disposed to surround the side surface of the panel supporting member 120 and the side surface of the guide frame 340 through the side cover 353 in order for the front cover 351 to be inserted into the side inserting space 120s of the panel supporting member 120. Therefore, the panel supporting member 120 coupled to the display panel 110 may move in at least one of X-axis, Y-axis, and Z-axis directions, inside the lower gap LG and the side gap SG that are prepared in the side inserting space 120s of the panel supporting member 120 by the front cover 351 of the cover member 350.

As described above, the display apparatus 30 according to the third embodiment of the present invention can provide the same effects as those of the display apparatus 10 according to the first embodiment of the present invention.

Figure 16:
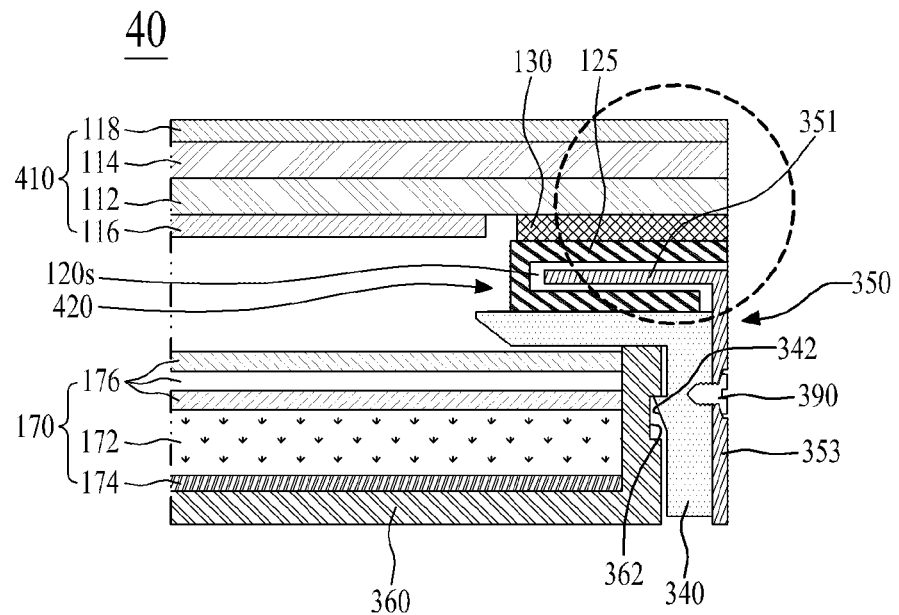
FIG. 16 is a view schematically illustrating a display apparatus according to a fourth embodiment of the present invention.

FIG. 16 is a view schematically illustrating a display apparatus according to a fourth embodiment of the present invention.

Referring to FIG. 16, a display apparatus 40 according to the third embodiment of the present invention includes a display panel 410, a panel supporting member 420 that is formed to have a side inserting space 120s and supports a rear edge of the display panel 410, an adhesive member 130 that is formed at the panel supporting member 420 and couples the display panel 410 and the panel supporting member 420, a guide frame 340 that supports the panel supporting member 420, a supporting cover 360 that supports the guide frame 340, and a cover member 350 that is inserted into the side inserting space 120s of the panel supporting member 420 and disposed to surround a side surface of the guide frame 340 so as to enable the movement of the panel supporting member 420. Except for the display panel 410 and the panel supporting member 420, the display apparatus 40 having such a configuration includes the same elements as those of the display apparatus 30 according to the third embodiment of the present invention, and thus, the description of the display apparatus 30 is applied to the same elements.

The display panel 410, as illustrated in a circular dot line of FIG. 16, is configured identically to the display panel 110 of the display apparatus 30 according to the third embodiment of the present invention, except that the display panel 210 is formed longer than the display panel 110 to overlap with an entire front cover 351 of the cover member 150.

The panel supporting member 420 is configured identically to the panel supporting member 120 of the display apparatus 30 according to the third embodiment of the present invention, except that the panel supporting member 220 is formed longer than the panel supporting member 120 in order for the panel disposing part 125 to overlap with the entire front cover 351.

The front cover 351 of the cover member 350 overlaps with a panel disposing part 125 of the panel supporting member 220 and the display panel 410, and thus is not exposed to the outside.

In the display apparatus 40 according to the fourth embodiment of the present invention, the display panel 410 is formed to overlap with the front cover 351 of the cover member 350, and thus can configure a display product such as a television even without a separate element, for example, a set cover. However, in the display apparatus 10 according to the first embodiment of the present invention, since a portion of the front cover 151 is exposed to the outside, a separate element such as the set cover is required for configuring a display product. Therefore, the display apparatus 40 according to the fourth embodiment of the present invention may be used as a display module, for example, a liquid crystal display module, but the display apparatus 30 according to the third embodiment of the present invention may be used as a display module or a display product.

The display apparatus 40 according to the fourth embodiment of the present invention can provide the same effects as those of the display apparatus 30 according to the third embodiment of the present invention. Moreover, in the display apparatus 40 according to the fourth embodiment of the present invention, the display panel 410 is formed to overlap with the front cover 351 of the cover member 350, thus more enhancing a sense of beauty in design.

Figure 17:
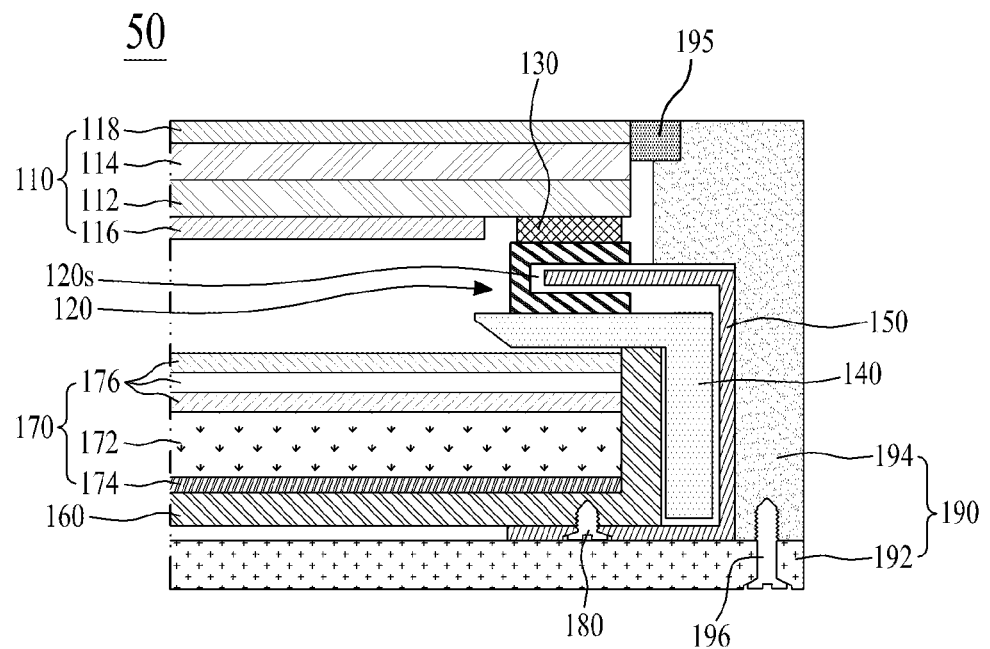
FIG. 17 is a view schematically illustrating a display apparatus according to a fifth embodiment of the present invention.

FIG. 17 is a view schematically illustrating a display apparatus according to a fifth embodiment of the present invention.

Referring to FIG. 17, a display apparatus 50 according to the fifth embodiment of the present invention includes a display panel 110, a panel supporting member 120 that is formed to have a side inserting space 120s and supports a rear edge of the display panel 110, an adhesive member 130 that is formed at the panel supporting member 120 and couples the display panel 110 and the panel supporting member 120, a guide frame 140 that supports the panel supporting member 120, a supporting cover 160 that supports the guide frame 140, a cover member 150 that is inserted into the side inserting space 120s of the panel supporting member 120 and disposed to surround a side surface of the guide frame 140 so as to enable the movement of the panel supporting member 120, and a set cover 190 that supports the supporting cover 160 and surrounds the cover member 150 and a side surface of the display panel 110 other than a front surface of the display panel 110. Except for the set cover 190, the display apparatus 50 having such a configuration includes the same elements as those of the display apparatus 10 according to the first embodiment of the present invention, and thus, the description of the display apparatus 10 is applied to the same elements.

The set cover 190 includes a set plate 192 and a set side wall 194.

The set plate 192 is formed in a flat type and supports the supporting cover 160 and the cover member 150. The set plate 192 acts as a rear cover of the produced display apparatus 50. That is, the set plate 192 may be used as a rear cover of a display product such as a television or a notebook computer.

The set side wall 194 surrounds the side surface of the display panel 110 other than the front surface of the display panel 110, and a front cover and side cover of the cover member 150 exposed to the outside. For this end, the set side wall 194 is formed to have a ¬-shape and disposed along an edge portion of the set plate 192. In this case, the set side wall 194 is coupled to the set plate 192 by a screw 196 that is coupled to the set side wall 194 through the set plate 192. The set side wall 194 configures a front border of the display panel 110, and acts as a side cover of the produced display apparatus 50. That is, the set plate 192 may be used as a side cover of a display product such as a television or a notebook computer.

In separately manufacturing the display panel 110 and the set cover 190, a gap space due to a process error is formed between the set side wall 194 and a side surface of the display panel 110 because the process error occurs in manufacturing. Due to this reason, foreign substances such as dust penetrate into the display apparatus 50 through the gap space. To prevent such a limitation, the display apparatus 50 according to the fifth embodiment of the present invention may further include a sealing member 195 that seals the gap space.

The sealing member 195 seals the gap space between the set side wall 194 and the side surface of the display panel 110, and thus prevents foreign substances such as dust from penetrating into the display apparatus 50 through the gap space. In this case, the sealing member 195 is formed to have the same color such that an aesthetic effect does not decrease due to a color difference between the set side wall 194 and the sealing member 195.

A sealing member 195 according to an embodiment is integrated with the set side wall 194 by a double injection process, and seals the gap space between the set side wall 194 and the side surface of the display panel 110.

A sealing member 195 according to another embodiment is formed in a ring shape or a pin shape, and inserted into the gap space between the set side wall 194 and the side surface of the display panel 110 to seal the gap space.

The display apparatus 50 according to the fifth embodiment of the present invention surrounds the side surface and rear surface of the display apparatus 10 according to the first embodiment of the present invention by using the set cover 190, and thus enables the practical use of a display product with a minimized thickness and an enhanced sense of beauty, for example, a television.

Figure 18:
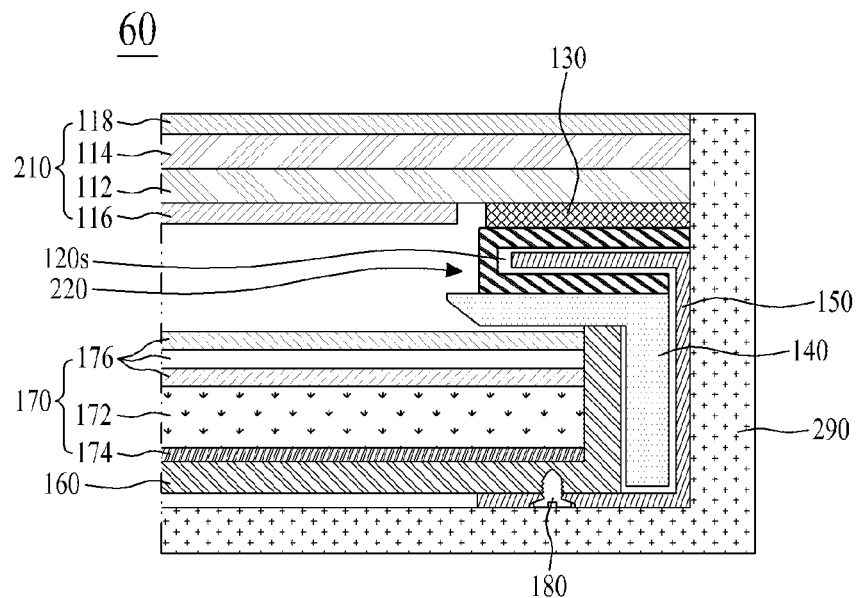
FIG. 18 is a view schematically illustrating a display apparatus according to a sixth embodiment of the present invention.

FIG. 18 is a view schematically illustrating a display apparatus according to a sixth embodiment of the present invention.

Referring to FIG. 18, a display apparatus 60 according to the sixth embodiment of the present invention includes a display panel 210, a panel supporting member 220 that is formed to have a side inserting space 120s and supports a rear edge of the display panel 210, an adhesive member 130 that is formed at the panel supporting member 220 and couples the display panel 210 and the panel supporting member 220, a guide frame 140 that supports the panel supporting member 220, a supporting cover 160 that supports the guide frame 140, a cover member 150 that is inserted into the side inserting space 120s of the panel supporting member 220 and disposed to surround a side surface of the guide frame 140 so as to enable the movement of the panel supporting member 220, and a set cover 290 that supports the supporting cover 160 and surrounds the cover member 150 and a side surface of the display panel 210 other than a front surface of the display panel 210. Except for the set cover 290, the display apparatus 60 having such a configuration includes the same elements as those of the display apparatus 20 according to the second embodiment of the present invention, and thus, the description of the display apparatus 20 is applied to the same elements.

The set cover 290 supports the supporting cover 160 and the cover member 150, and surrounds a side cover of the cover member 150 and a side surface of the display panel 210 other than a front surface of the display panel 210. For this end, the set cover 290 is formed in a U-shape to include a set plate and a set side wall bent from the set plate. In this case, the set cover 290 may be coupled to the cover member 150 through the set side wall, or coupled to the cover member 150 or the supporting cover 160 by a screw (not shown) that is coupled to the supporting cover 160 through the set plate. The set cover 290 configures a front border of the display panel 210 through the set side wall, and acts as a rear product cover and side product cover of the produced display apparatus 60. That is, the set cover 290 may be used as a product cover that is externally exposed to surround portions other than the front surface of the display panel 210 of a display product such as a television or a notebook computer.

The display apparatus 60 according to the sixth embodiment of the present invention may further include a sealing member (not shown) that seals a gap space between the side surface of the display panel 210 and the set side wall of the set cover 290. The sealing member is formed to be integrated with the set side wall by a double injection process, or formed in a ring shape or a pin shape to seal the gap space.

The display apparatus 60 according to the sixth embodiment of the present invention surrounds the side surface and rear surface of the display apparatus 20 according to the second embodiment of the present invention by using the set cover 290, and thus enables the practical use of a display product with a minimized thickness and an enhanced sense of beauty, for example, a television.

Figure 19:
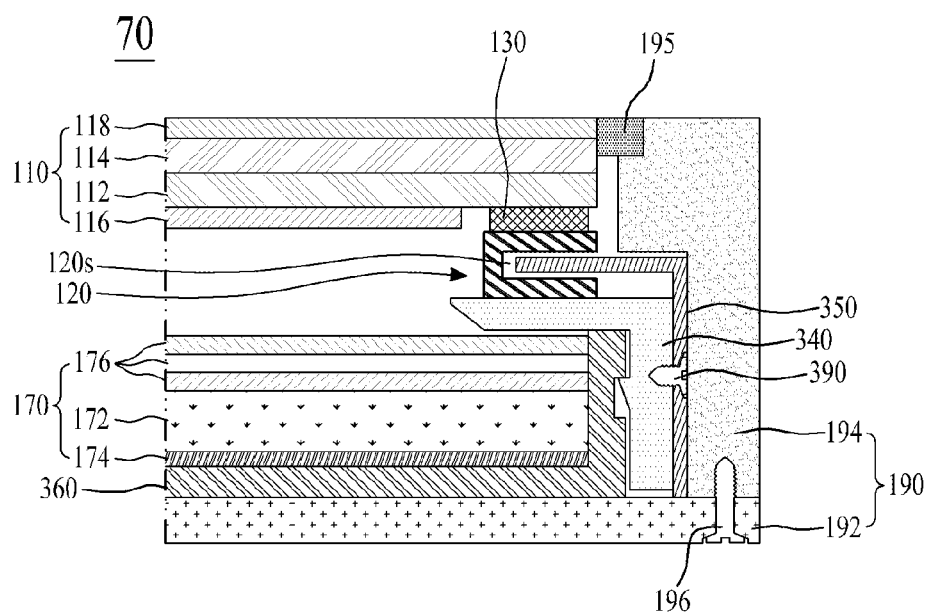
FIG. 19 is a view schematically illustrating a display apparatus according to a seventh embodiment of the present invention.

FIG. 19 is a view schematically illustrating a display apparatus according to a seventh embodiment of the present invention.

Referring to FIG. 19, a display apparatus 70 according to the seventh embodiment of the present invention includes a display panel 110, a panel supporting member 120 that is formed to have a side inserting space 120s and supports a rear edge of the display panel 110, an adhesive member 130 that is formed at the panel supporting member 120 and couples the display panel 110 and the panel supporting member 120, a guide frame 340 that supports the panel supporting member 120, a supporting cover 360 that supports the guide frame 340, a cover member 350 that is inserted into the side inserting space 120s of the panel supporting member 120 and disposed to surround a side surface of the guide frame 340 so as to enable the movement of the panel supporting member 120, and a set cover 190 that supports the supporting cover 360 and surrounds the cover member 350 and a side surface of the display panel 110 other than a front surface of the display panel 110. The display apparatus 70 having such a configuration is configured to surround the side surface and rear surface of the display apparatus 30 according to the third embodiment of the present invention by using set cover 190 of the display apparatus 50 according to the fifth embodiment of the present invention, and thus, the description of the display apparatus 50 is applied to the display apparatus 70.

Accordingly, the display apparatus 70 according to the seventh embodiment of the present invention surrounds the side surface and rear surface of the display apparatus 30 according to the third embodiment of the present invention by using the set cover 190, and thus enables the practical use of a display product with a minimized thickness and an enhanced sense of beauty, for example, a television.

Figure 20:
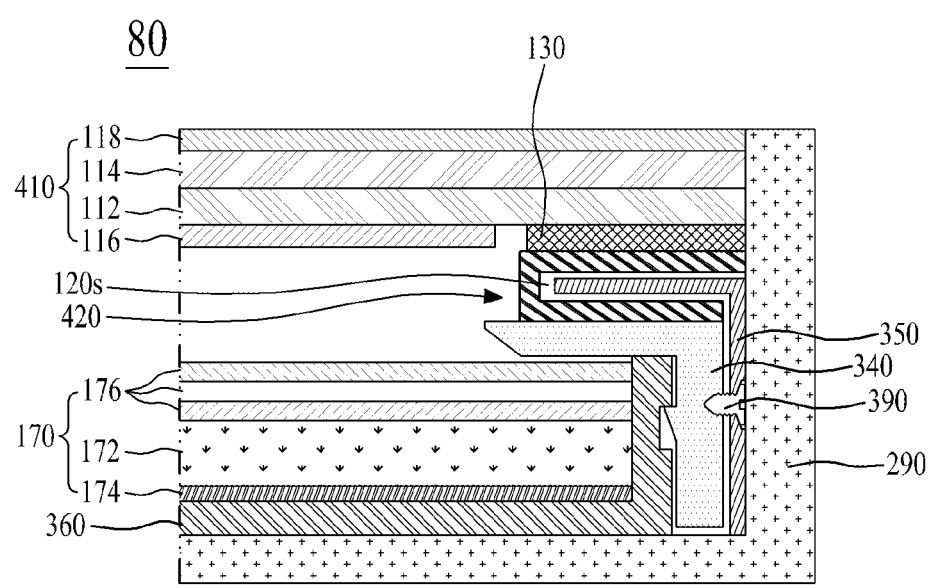
FIG. 20 is a view schematically illustrating a display apparatus according to an eighth embodiment of the present invention.

FIG. 20 is a view schematically illustrating a display apparatus according to an eighth embodiment of the present invention.

Referring to FIG. 20, a display apparatus 80 according to the eighth embodiment of the present invention includes a display panel 410, a panel supporting member 420 that is formed to have a side inserting space 120s and supports a rear edge of the display panel 410, an adhesive member 130 that is formed at the panel supporting member 420 and couples the display panel 410 and the panel supporting member 420, a guide frame 340 that supports the panel supporting member 420, a supporting cover 360 that supports the guide frame 340, a cover member 350 that is inserted into the side inserting space 120s of the panel supporting member 420 and disposed to surround a side surface of the guide frame 340 so as to enable the movement of the panel supporting member 420, and a set cover 290 that supports the supporting cover 360 and surrounds the cover member 350 and a side surface of the display panel 410 other than a front surface of the display panel 410. The display apparatus 80 having such a configuration is configured to surround the side surface and rear surface of the display apparatus 40 according to the fourth embodiment of the present invention by using set cover 290 of the display apparatus 60 according to the sixth embodiment of the present invention, and thus, the description of the display apparatus 60 is applied to the display apparatus 80.

Accordingly, the display apparatus 80 according to the eighth embodiment of the present invention surrounds the side surface and rear surface of the display apparatus 40 according to the fourth embodiment of the present invention by using the set cover 290, and thus enables the practical use of a display product with a minimized thickness and an enhanced sense of beauty, for example, a television.

As described above, in the display apparatus according to embodiments of the present invention, the display panel is coupled to the panel supporting member by the adhesive member, the panel supporting member coupled to the display panel is disposed at the guide frame, and then the cover member movably surrounds the panel supporting member coupled to the display panel.

According to the embodiments of the present invention, by removing the existing upper case, the thickness of the display apparatus can be minimized.

Moreover, the entire front surface of the display panel is exposed to the outside, thus enhancing a sense of beauty in design. Moreover, the panel supporting member coupled to the display panel moves, thus preventing light leakage due to the non-movement of the display panel.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A display apparatus comprising:
    a display panel;
    a panel supporting member having a side inserting space, and supporting a rear edge of the display panel;
    an adhesive member between the display panel and the panel supporting member;
    a guide frame supporting the panel supporting member; and
    a cover member inserted into the side inserting space of the panel supporting member, and surrounding a side surface of the guide frame, thereby enabling movement of the panel supporting member,
    wherein the panel supporting member comprises:
    a frame disposing part on the guide frame;
    a panel disposing part facing the frame disposing part; and
    a vertical portion between the frame disposing part and the panel disposing part.

2. The display apparatus of claim 1, wherein the panel supporting member is coupled to a bottom edge portion of the display panel by the adhesive member for the display panel to move in at least one of X-axis, Y-axis, and Z-axis directions.

3. The display apparatus of claim 1, wherein a top and side surface of the display panel are exposed to the outside without being surrounded by the panel supporting member, the guide frame and the cover member.

4. The display apparatus of claim 1, wherein the cover member comprises:
    a front cover inserted into the side inserting space of the panel supporting member; and
    a side cover bent from the front cover, and surrounding a side surface of the frame disposing part and the side surface of the guide frame.

5. The display apparatus of claim 4, wherein the front cover is inserted into the side inserting space to be respectively separated from the frame disposing part and the vertical portion by a certain distance.

6. he display apparatus of claim 5, wherein the front cover is inserted into the side inserting space to be separated from the frame disposing part by a certain distance.

7. The display apparatus of claim 4, wherein the cover member is formed in a tetragonal frame shape to have a ⊏-shaped sectional surface by the front cover and the side cover.

8. The display apparatus of claim 4, further comprising:
    a supporting cover supporting the guide panel; and
    a coupling member coupling the cover member to the supporting cover.

9. The display apparatus of claim 8, further comprising a backlight unit placed in the supporting cover, and irradiating light on the display panel.

10. The display apparatus of any one of claim 8, further comprising a set cover supporting the supporting cover, and surrounding the side cover of the cover member and a side surface of the display panel other than a front surface of the display panel.

11. The display apparatus of claim 10, wherein the set cover comprises:
    a set plate supporting the supporting cover; and
    a set side wall disposed at an edge of the set plate and formed in a ㄱ-shape to surround the front cover and side cover of the cover member and the side surface of the display panel other than the front surface of the display panel.

12. The display apparatus of claim 11, further comprising a gap sealing member integrated with the set side wall to seal a gap space between the side surface of the display panel and the set side wall, or inserted into a gap space between the side surface of the display panel and the set side wall to seal the gap space.

13. The display apparatus of any one of claim 8, wherein, the display panel is disposed to overlap with an entire top of the front cover, and
    the panel disposing part is disposed to overlap with the entire top of the front cover.

14. The display apparatus of claim 13, further comprising a set cover supporting the supporting cover, and surrounding the side cover of the cover member and a side surface of the display panel other than a front surface of the display panel.

15. The display apparatus of claim 1, wherein the panel supporting member is formed in a tetragonal frame shape to comprise the frame disposing part, vertical portion, and panel disposing part.

16. The display apparatus of claim 15, wherein the panel supporting member further comprises a plurality of slits which are disposed at certain intervals in at least one of the panel disposing part and the frame disposing part.

17. The display apparatus of claim 1, wherein the panel supporting member comprises first to fourth supporting brackets which are formed to comprise the frame disposing part, vertical portion, and panel disposing part, coupled to respective edge portions of long sides and short sides of the display panel by the adhesive member, and supported by the guide frame.

18. The display apparatus of claim 17, wherein the panel supporting member further comprises a plurality of slits which are formed at certain intervals at the panel disposing part of each of the first to fourth supporting brackets, the adhesive member being disposed at the panel disposing part.

19. The display apparatus of claim 1, wherein the panel supporting member comprises first to fourth supporting brackets which are formed to comprise the frame disposing part, vertical portion, and panel disposing part, coupled to respective rear edge portions of the display panel at certain intervals by the adhesive member, and supported by the guide frame.

20. The display apparatus of claim 19, further comprising a plurality of pads disposed at the guide frame in correspondence with respective gaps between the supporting brackets to seal the respective gaps between the supporting brackets.

21. The display apparatus of claim 19, wherein each of the supporting brackets further comprises:
   a pair of adhesive member guide parts disposed in parallel to each other to be separated from a top of the panel disposing part by a certain distance; and
   a corner cutting part disposed at both side end portions of each of the pair of adhesive member guide parts.

22. The display apparatus of claim 21, wherein each of the supporting brackets further comprises a pad member which is formed of a soft material at the corner cutting part.

23. The display apparatus of claim 19, wherein each of the supporting brackets further comprises a pair of adhesive member guide parts which are formed of a soft material, and disposed in parallel to each other to be separated from a top of the panel disposing part by a certain distance.

\* \* \* \* \*